United States Patent
Kofol (10) Patent No.: US 7,463,092 B2
(45) Date of Patent: Dec. 9, 2008

(54) AMPLIFIER WITH VARIABLE IMPEDANCE TRANSFORMATION AND METHOD OF AMPLIFICATION USING THE SAME

(75) Inventor: John Stephen Kofol, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 125 days.

(21) Appl. No.: 11/514,148

(22) Filed: Sep. 1, 2006

(65) Prior Publication Data

US 2008/0055002 A1    Mar. 6, 2008

(51) Int. Cl.
*H03G 3/20* (2006.01)
(52) U.S. Cl. .................................. 330/136; 330/129
(58) Field of Classification Search ............ 330/129, 330/136, 279, 302
See application file for complete search history.

(56) References Cited

U.S. PATENT DOCUMENTS

| | | | | |
|---|---|---|---|---|
| 6,097,252 A | * | 8/2000 | Sigmon et al. | 330/136 |
| 7,102,429 B2 | * | 9/2006 | Stengel et al. | 330/136 |

* cited by examiner

*Primary Examiner*—Henry K Choe (57) ABSTRACT

A radio frequency (RF) amplifier includes an RF drive adjust circuit adapted to receive an input signal and adjust at least one of the amplitude and phase thereof to output a drive-adjusted input signal; a gain element adapted to amplify the drive-adjusted input signal and to output an amplified signal; and a dynamic impedance transformer adapted to receive the amplified signal, to output an output signal, and to transform a load impedance presented to the gain element by a load in accordance with a desired amplitude of an envelope of the output signal.

19 Claims, 6 Drawing Sheets

AMPLIFIER WITH VARIABLE IMPEDANCE TRANSFORMATION AND METHOD OF AMPLIFICATION USING THE SAME

BACKGROUND

Radio Frequency (RF) amplifiers are used in a variety of devices, including mobile communications devices, such as mobile telephones. In particular, an RF power amplifier is employed to amplify and transmit an RF signal from a mobile communication device.

The data to be transmitted from the mobile communication device may be impressed upon the transmitted RF signal by employing any one of a number of modulation techniques. Some of the techniques that are employed in contemporary communication devices produce transmitted signals with an RF amplitude envelope that varies with time. Some examples of transmission protocols that produce transmitted signals with an RF amplitude envelope that varies with time include Code Division Multiple Access ("CDMA"), Wideband Code Division Multiple Access ("WCDMA"), and Orthogonal Frequency Division Multiplexing ("OFDM").

Figure 1:
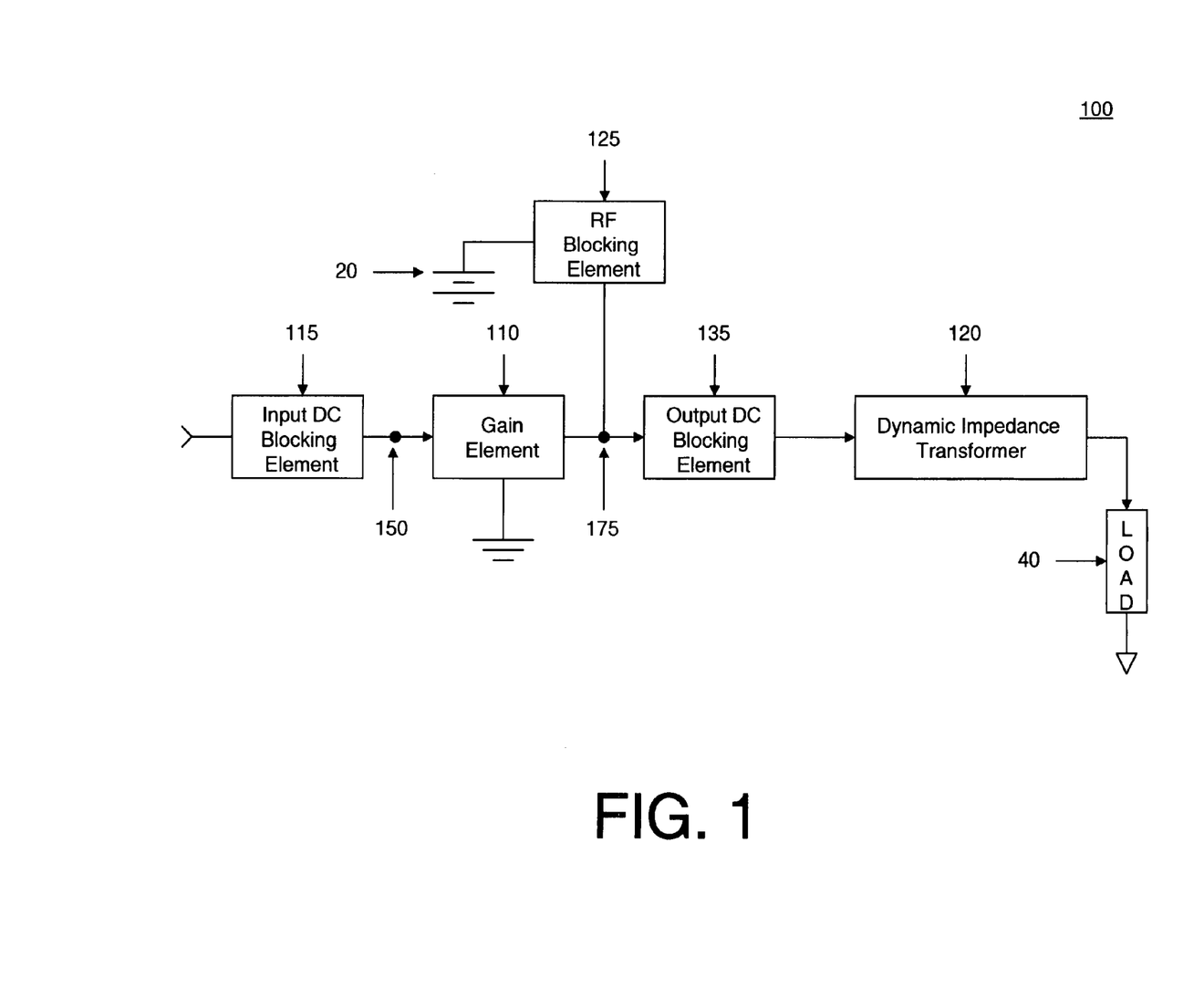
FIG. 1 shows an exemplary RF amplifier.

FIG. 1 shows an exemplary RF power amplifier 100 that may be employed in a mobile communication device operating with a CDMA protocol. RF power amplifier 100 includes gain element 110 and RF impedance transformer 120. RF power amplifier 100 further includes input DC blocking element 115, RF blocking element 125, and output DC blocking element 135. In general, gain element 110 may comprise an RF power transistor such as a field effect transistor (FET) or bipolar junction transistor (BJT), biased as appropriate. In general, RF impedance transformer 120 is an approximate loss-less network of fixed-value capacitive and/or inductive elements for matching an output impedance of gain element 110 to an impedance of a load 40 (e.g., an antenna). Input and output DC blocking elements 115, 135 are in most cases capacitors, while RF blocking element 125 in most cases is an inductor or transmission line presenting a high impedance at the operating RF frequencies.

In operation, an RF input signal is supplied through input DC blocking element 115 to a node 150 which corresponds to an input of gain element 110. DC current is also supplied to gain element 110 from a DC power source (e.g., a battery) 20 though RF blocking element 125. Gain element 110 amplifies the RF input signal and outputs an amplified signal at node 175. The amplified signal is passed by RF impedance transformer 120 as an RF output signal to load 40 (e.g., an antenna).

Meanwhile, at node 175 the average voltage is constrained to be the voltage $V_{CC}$ of the DC power source. Also, at node 175 the instantaneous voltage will be constrained by the operating requirements of gain element 110. For example, if gain element 110 is a bipolar transistor connected in common-emitter configuration, the instantaneous voltage at node 175 will be constrained to be greater than zero. Furthermore, gain element 110 is in general required to provide a certain RF output power to load 40. The RF output power delivered by gain element 110 at node 175 is:

$$\text{Power} = \text{REAL}\{(V_{RF}^* I_{RF}^*)^2\} \quad (1)$$

where $V_{RF}$ is the complex RF voltage at node 175, and $I_{RF}$ is the complex RF current.

Also, the RF impedance at node 175 looking toward load 40 is:

$$Z_G = V_{RF}/I_{RF} \quad (2)$$

Also the impedance of load 40 is in general selected for convenience to be something in the range of 50 ohms to 75 ohms. Meanwhile, the output impedance of gain element 110 must be low enough to enable RF power amplifier 100 to produce a required RF output power level, consistent with the aforementioned constraints on voltages at node 175.

Accordingly, RF impedance transformer 120 is employed to match the impedance of load 40 to the required output impedance of gain element 110. In particular, as discussed above, RF impedance transformer 120 is an approximate loss-less network of fixed-value capacitive and/or inductive elements selected for maximizing the power transfer from gain element 110 to load 40. That is, RF impedance transformer 120 is, to a great approximation, a linear time invariant (LTI) network.

Meanwhile, an RF power amplifier that transmits the output signal from a mobile communication device often represents the largest power drain on the mobile power supply (e.g., a battery). Also, the required time between battery charges is often shorter than desired. The required time between charges can be lengthened if the efficiency of the RF power amplifier could be improved. Furthermore, in other applications of RF amplifiers where the transmitted power is very large, such as in television broadcast transmitter that operates 25 hours/day, 365 days/year, the electricity costs can become significant. These costs can be reduced if the efficiency of the RF transmitter amplifier can be improved.

Turning again to FIG. 1, for a particular value of transformed RF load impedance at node 175, and for a particular battery voltage $V_{CC}$, there will be one RF output power level for which RF amplifier 100 converts DC (e.g., battery) energy into RF transmit energy with maximum efficiency. Because the maximum energy conversion efficiency occurs at only one RF output level, signals which have a time-varying RF amplitude envelope (e.g., CDMA; WCDMA) will almost always cause RF amplifier 100 to operate at less than peak, or maximum, energy conversion efficiency.

Meanwhile, for RF amplifier 100, maximum energy conversion efficiency almost always occurs at an RF output power level that is higher than the RF output level where the RF power gain is at a maximum. That is, maximum energy conversion efficiency occurs when RF amplifier 100 is in significant gain compression. However, when CDMA or WCDMA signals (and many other signals) are applied to RF amplifier 100 in a state where it is gain compression, then the signals are distorted in a non-linear way, causing their spectral widths to grow substantially. Meanwhile, there are specifications which limit the spectral occupancy of these signals to prevent interference. Accordingly, to avoid the spectral expansion that occurs by the gain compression at or near the point of maximum power conversion efficiency, when RF amplifier 100 amplifies such signals, it is operated at a point well below maximum energy conversion efficiency.

The result is that RF amplifier 100 and similar amplifiers operating with CDMA and WDMA, and similar signals, are operating at far from maximum efficiency in converting DC power to RF transmitted power. As explained above, in a mobile device this can be a significant limitation on the battery life, and in very high power transmit applications, it can increase the operating (electricity) costs.

What is needed, therefore, is an RF amplifier with improved power conversion efficiency. What is also needed is an RF amplifier that can provide improved power conversion efficiency when operating with signals having time-varying RF amplitude envelopes. What is further needed is an RF amplifier that can provide improved power conversion efficiency when operating with signals having time-varying RF amplitude envelopes without causing the signal spectral bandwidth to expand beyond an acceptable level.

SUMMARY

In an example embodiment, a radio frequency (RF) amplifier, comprises: an amplitude detector a; an RF drive adjust circuit adapted to receive an input signal and to adjust at least one of the amplitude and phase thereof in response to a first control signal to produce a drive-adjusted input signal; a drive controller adapted to provide the first control signal to the RF drive adjust circuit in response to an output of the amplitude detector; a gain element adapted to amplify the drive-adjusted input signal and to output an amplified signal; a dynamic impedance transformer adapted to receive the amplified signal and a second control signal, to output an output signal, and to transform a load impedance presented to the gain element by a load in accordance with the second control signal; and a dynamic impedance transformer controller adapted to provide the second control signal to the dynamic impedance transformer in accordance with a desired amplitude of an envelope of the output signal In another example embodiment, a method of amplifying a radio frequency (RF) signal, comprising: receiving an input signal; adjusting at least one of an amplitude and a phase of the input signal; amplifying the adjusted input signal with a gain element to produce an output signal; transforming a load impedance presented to the gain element by a load in accordance with a desired amplitude of an envelope of the output signal.

In yet another example embodiment, a radio frequency (RF) amplifier comprises: an RF drive adjust circuit adapted to receive an input signal and to adjust at least one of the amplitude and phase thereof to output a drive-adjusted input signal; a gain element adapted to amplify the drive-adjusted input signal and to output an amplified signal; and a dynamic impedance transformer adapted to receive the amplified signal, to output an output signal, and to transform a load impedance presented to the gain element by a load in accordance with a desired amplitude of an envelope of the output signal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, microwave and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other.

Figure 2:
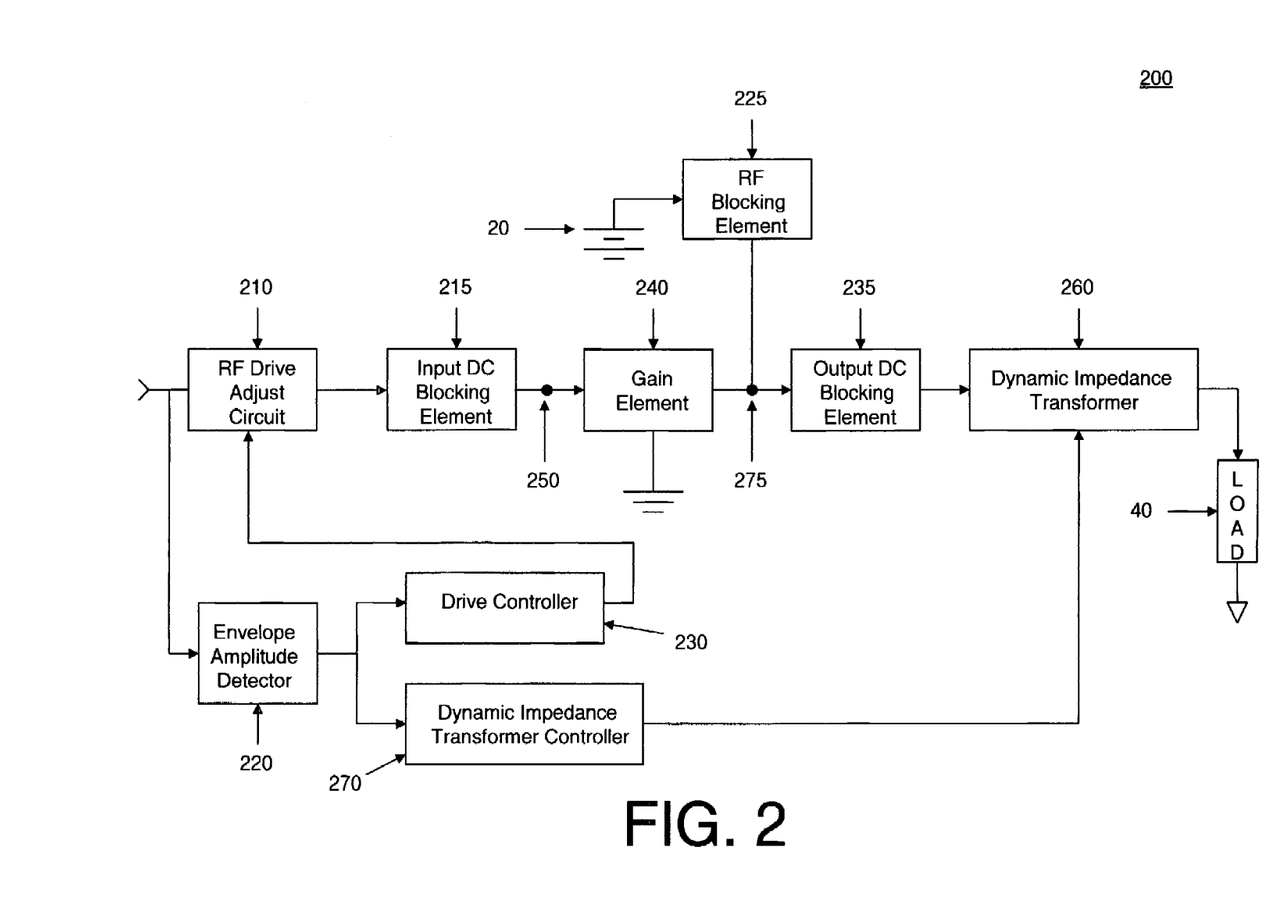
FIG. 2 shows one embodiment of an RF amplifier.

FIG. 2 shows one embodiment of an RF amplifier 200 configured as a polar modulator. RF amplifier 200 includes: an RF drive adjust circuit 210; envelope amplitude detector 220; a drive controller 230; a gain element 240; a dynamic impedance transformer 260; and a dynamic impedance transformer controller 270. RF amplifier 200 further includes input DC blocking element 215, RF blocking element 225, and output DC blocking element 235. In general, gain element 240 may comprise an RF power transistor such as a field effect transistor (FET) or bipolar junction transistor (BJT), biased as appropriate. Input and output DC blocking elements 215, 235 are in most cases capacitors, while RF blocking element 225 in most cases is an inductor or transmission line presenting a high impedance at the operating RF frequencies. As seen in FIG. 2, an output of dynamic impedance transformer 260 is connected to load 40 (e.g., an antenna) which is not part of RF amplifier 200.

Before providing a detailed description of the operation of RF amplifier 200, one or more general principles affecting its operation will now be described. In particular, the average voltage at node 275 is constrained to be the voltage $V_{CC}$ of the DC power source 20, and the instantaneous voltage is approximately constrained to be greater than zero volts by the operating requirements of gain element 240.

However, unlike RF amplifier 100 discussed above, where RF impedance transformer 120 employed linear time invariant (LTI) elements, dynamic impedance transformer 260 of RF amplifier 200 includes time-varying elements whose impedance values may be adjusted as desired in a dynamic manner. That is, while in RF amplifier 100 the RF impedance $Z_G$ at node 175 is time invariant (assuming load 40 is also time invariant (as it almost always is)), in contrast the RF impedance $Z_{G2}$ at node 275 in RF amplifier 200 may be controlled and varied with time.

In particular, in the RF amplifier 200, the characteristics of dynamic impedance transformer 260 are adjusted in a way that causes the envelope of an RF output signal at load 40 to have a desired time-varying amplitude.

According to such an arrangement, the impedance $Z_{G2}$ at node 275 seen by gain element 240 looking toward load 40 can be adjusted to maximize the power conversion efficiency of RF amplifier 200 for all values of the amplitude of the RF envelope of the RF output signal at load 40. That is, RF amplifier 200 can be controlled to operate always in a condition of gain compression and maximum conversion efficiency, despite variations in the amplitude of the envelope of the RF input signal supplied to it. In that case, even though gain element 240 is operated always in a non-linear state of gain compression, dynamic impedance transformer 260 may be controlled to insure that the energy of the RF output signal emanating from RF amplifier 200 is confined to a well-defined band of frequencies (e.g., does not experience excessive growth of its spectral width) and that the overall gain characteristic of RF amplifier 200 remains approximate linear.

In operation, an RF input signal is provided to RF amplifier 200 at an input to RF drive adjust circuit 210. Meanwhile, envelope amplitude detector 220 detects the amplitude of the envelope of the RF input signal and provides an RF input signal envelope amplitude detection signal to drive controller 230 and to dynamic impedance transformer controller 270.

In response to the RF input signal envelope amplitude detection signal, drive controller 230 provides a first control signal to RF drive adjust circuit 210 to adjust an amplitude and/or phase of the RF input signal. It should be understood that the first control signal may comprise one or more individual voltage waveforms communicated across one or more signal lines. Further details as to how the first control signal is determined will be described below.

In response to the first control signal, RF drive adjust circuit 210 outputs a drive-adjusted RF input signal, through DC blocking element 215, to node 250 which is an input of gain element 240. That is, RF drive adjust circuit 210 provides an RF drive signal to gain element 240. Further details of the drive adjustment will be described below. DC current is also supplied to gain element 240 from DC power source (e.g., a battery) 20 though RF blocking element 225. Gain element 240 may be supplied with additional DC bias voltages and currents not shown. Gain element 240 amplifies the drive-adjusted RF input signal and outputs an amplified RF signal at node 275.

The amplified RF signal is passed by output DC blocking element 235 to dynamic impedance transformer 260. Meanwhile, in response to the RF input signal envelope amplitude detection signal, dynamic impedance transformer controller 270 provides a second control signal to dynamic impedance transformer 260. It should be understood that the second control signal may comprise one or more individual voltage waveforms communicated across one or more signal lines. Further details as to how the second control signal is determined will be described below. In response to the second control signal, dynamic impedance transformer 260 changes impedance matching characteristics thereof, as will be described below. Meanwhile, dynamic impedance transformer 260 outputs the amplified RF signal to output the RF output signal to load 40 (e.g., an antenna).

It is noteworthy that in RF amplifier 200, gain element 240 does not output an amplified signal at node 275 whose voltage is proportional to the amplitude of the envelope of the RF output signal delivered to load 40. Nor does gain element 240 output an RF current that is proportional to the amplitude of the RF current through load 40. Indeed, the power of the drive-adjusted RF input signal provided to gain element 240 at node 250 is in general non-proportional to the power of the RF output signal delivered to load 40.

In the embodiment of FIG. 2, RF drive adjust circuit 210 adjusts the amplitude and/or phase of the RF input signal in a way that is coordinated with the changing characteristics of dynamic impedance transformer 260 to produce the desired RF output signal at load 40. More specifically, RF drive adjust circuit 210 and dynamic impedance transformer 260 are controlled such that: (1) the overall gain of RF amplifier 200 from the RF input signal to the RF output signal is approximate linear; and (2) the drive-adjusted input signal at node 250 and the amplified RF signal at node 275 are such that gain element 240 operates at or near its maximum energy conversion efficiency. In general, the second characteristic will mean that gain element 240 will operate in significant gain compression. Without dynamic impedance transformer 260, gain element 240 operating in significant gain compression would distort the RF output signal causing undesired growth in its spectral bandwidth. It would also mean that the overall gain characteristic would vary as a function of input signal, and therefore would not have a linear gain.

To better explain how RF drive adjust circuit 210 and dynamic impedance transformer 260 of RF amplifier 200 are controlled to achieve the above-stated objectives, an example will be described in a case when the amplitude of the RF input signal to RF amplifier is not large enough to cause gain element 240 to operate at its point of maximum energy conversion efficiency. In that case, then RF drive adjust circuit 210 is controlled by the first control signal to adjust the amplitude upward (amplifies it) to a required amplitude to provide an RF drive signal to gain element 240 of sufficient magnitude to cause gain element 240 to operate at its point of maximum energy conversion efficiency, which will in general place it into some amount of gain compression. That is, in this example, envelope amplitude detector 220 detects that the amplitude of the envelope of RF input signal and provides this information to drive controller 230. Drive controller determines that the RF input signal level is less than desired to operate at maximum energy conversion efficiency, generates an appropriate control signal, and provides the control signal to RF drive adjust circuit 210 to increase the amplitude of the RF input signal.

In turn, dynamic impedance transformer 260 will be controlled to transform the impedance of load 40 as seen by the output of gain element 240 in a dynamic manner such that the RF output signal delivered to load 40 has a relationship that is in general linear with respect to the RF input signal as the amplitude of the envelope of the RF input signal is varied.

Of course, variations in the particular details are possible. For example, RF drive adjust circuit 210 may be a programmable attenuator that can decrease the amplitude of the RF input signal but cannot increase it. In that case, the overall system must be designed such that the smallest RF input signal level at the input of RF amplifier 200 will always be of sufficient amplitude to cause gain element 240 to be able to operate at maximum energy conversion efficiency, without any need for further amplification by RF drive adjust circuit 210.

Furthermore, the drive controller 230 and dynamic impedance transformer 270 functional blocks may in some embodiments be realized by shared circuit element(s), which receive the RF input signal envelope amplitude detection signal and outputs both the first and second control signals.

In one embodiment, a calibration sequence is performed on RF amplifier 200 to determine the appropriate control signals that should be generated by drive controller 230 and dynamic impedance transformer controller 270 based on the amplitude and phase characteristics of the RF input signal. In that case, a predetermined calibration sequence may be applied as an RF input signal to RF amplifier 200, and the first and second control signals may be controlled to produce the desired characteristics wherein the overall gain of RF amplifier 200 is approximate linear; and gain element 240 operates at or near its maximum energy conversion efficiency. In that case, drive controller 230 and dynamic impedance transformer controller 270 may include a memory device (e.g., a flash memory device) storing information for generating the first and second control signals (e.g., a look-up table that inputs the RF input signal envelope amplitude detection signal and outputs corresponding values for the control signal).

Figure 3:
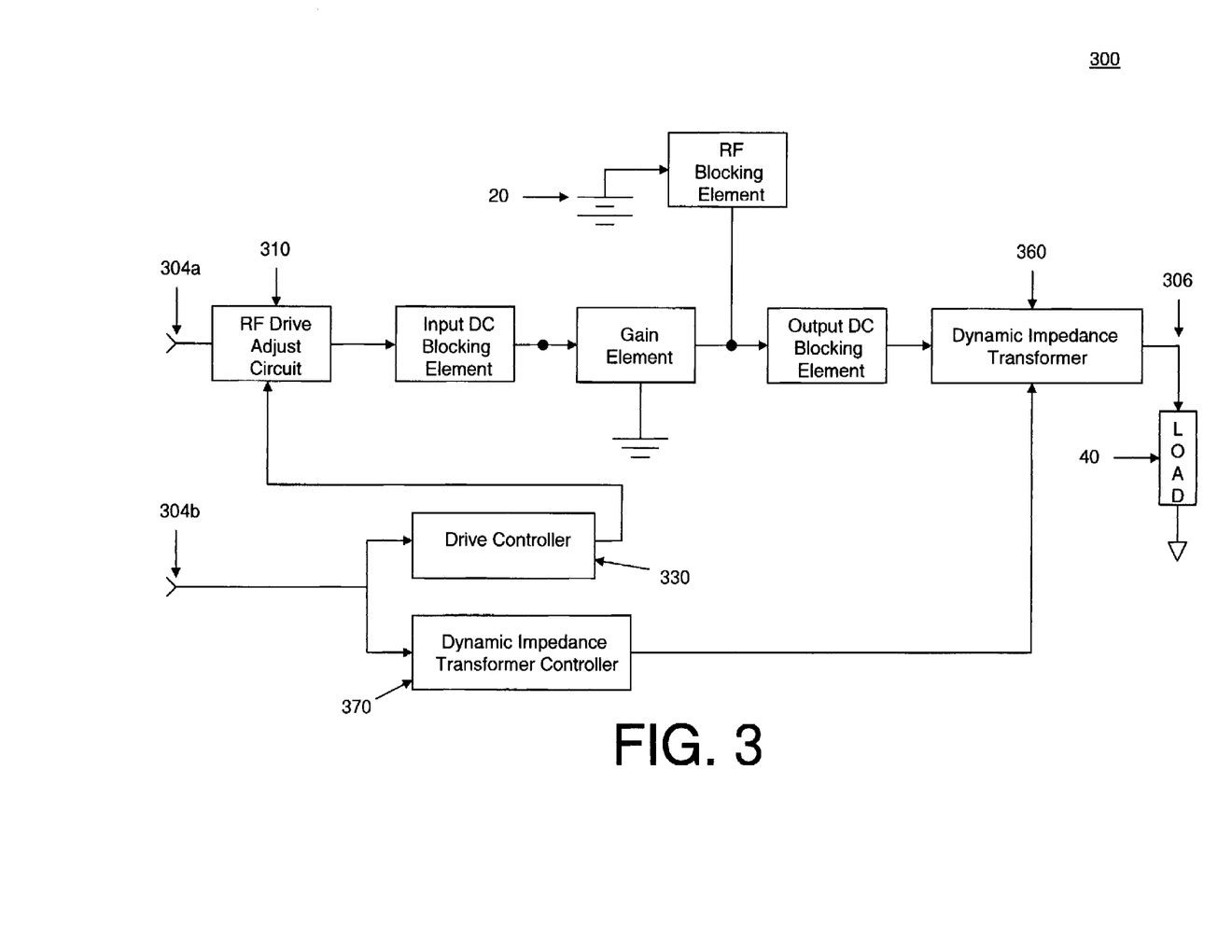
FIG. 3 shows one embodiment of an RF amplifier configured as a polar amplifier.

FIG. 3 shows an RF amplifier 300 configured to operate as a polar amplifier. More specifically, RF amplifier 300 receives an RF input signal at a first input 304a and a baseband (non- RF) input signal at a second input 304b, and provides an amplified RF output signal at an output 306. In contrast to the more general RF input signal applied to the RF amplifier 200 of FIG. 2 (which may have a time-varying envelope amplitude), the RF input signal applied to the first input 304a of RF amplifier 300 has a constant amplitude and carries phase information for data to be transmitted in the modulated RF waveform. Meanwhile, the baseband input signal is proportional to the amplitude of the envelope of the desired RF output signal to appear at output 306.

The operation of the RF amplifier 300 is similar to the operation described above for RF amplifier 200, with the following significant differences. The RF amplifier 300 does not need any envelope amplitude detector 220, because it already receives the baseband signal at input 304b. The baseband signal is applied to drive controller 330 to adjust the gain of RF drive adjust circuit 310, which is a variable-gain driver. Also, the baseband signal is applied to the dynamic impedance transformer controller 370 to control the dynamic impedance transformer 360.

The present inventor has recognized that, for many gain elements (for example, bipolar transistors connected in the "common-emitter" configuration) the following is approximately true: (1) if the voltage of the DC power source is chosen to be some particular value; (2) if RF load resistance, $R_L$, presented to the gain element's output node by the load, as transformed by dynamic impedance transformer, is caused to change; and (3) if the level of the RF drive at the gain element's input node is readjusted for each value of $R_L$ such that the gain element is (near-)optimally efficient at converting DC power into RF power to the load at the particular load resistance, $R_L$, then the value of the peak RF voltage at the gain element's output node at the RF output frequency will, to a rough approximation, be nearly the same value, $V_{RF}$, over a large range of load resistances, $R_L$. This means that a simplified RF amplifier can be provided using negative feedback from the gain element's output node to automatically control the drive amplitude the gain element's input node so that highly-efficient conversion of DC energy to RF energy is achieved by the gain element over a large range of load resistances as seen at the gain element's output node. Meanwhile, the power delivered by the gain element to the load, $R_L$, will be $V_{RF}^2/(2*R_L)$.

Figure 4:
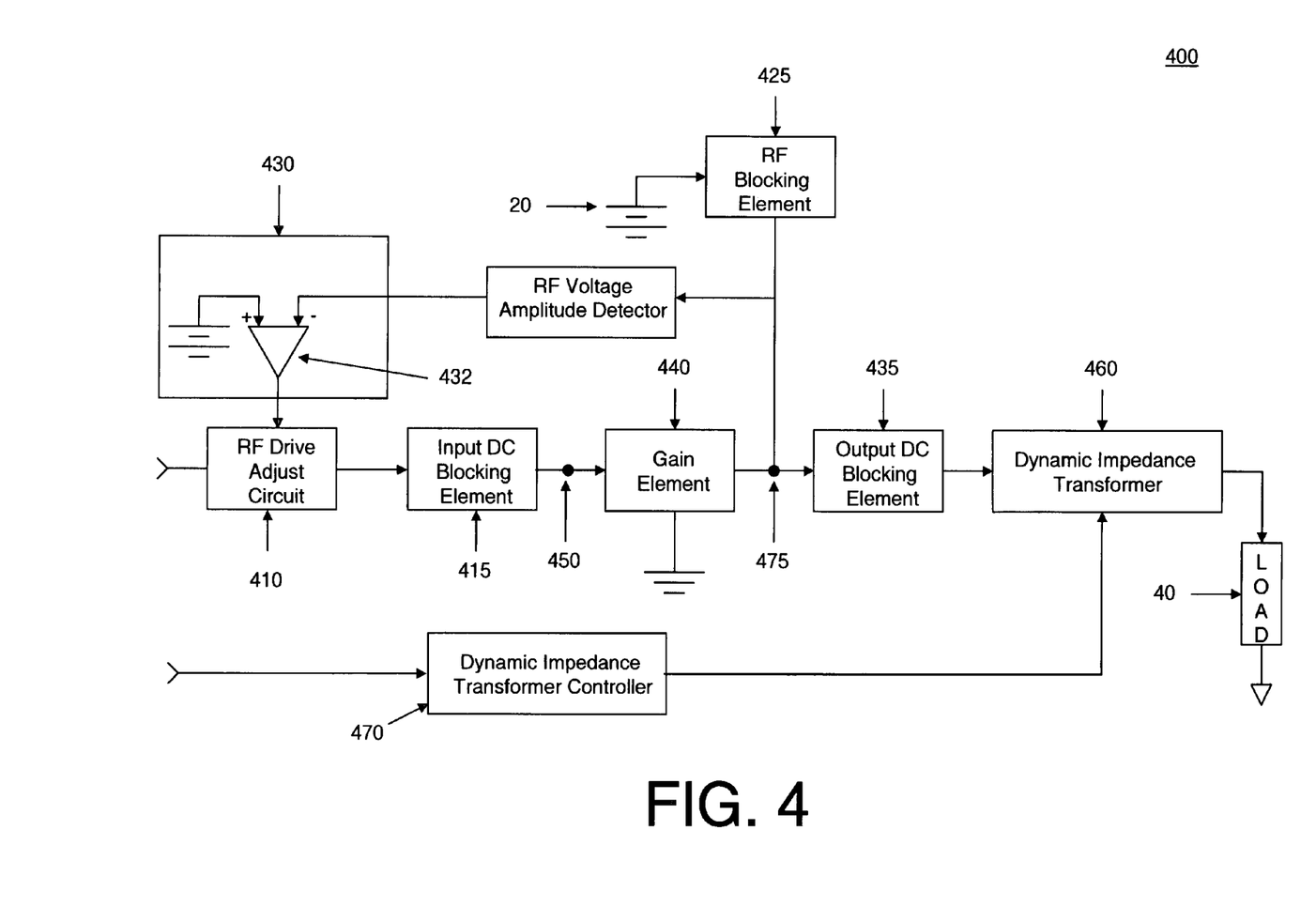
FIG. 4 shows another embodiment of an RF amplifier.

Accordingly, FIG. 4 shows an embodiment of an RF amplifier 400 that employs negative feedback to control the amplitude of the RF drive signal applied to the gain element. In particular, RF amplifier 400 employs a negative feedback loop to keep the gain element operating at or near maximum energy conversion efficiency. RF amplifier 400 includes: an RF drive adjust circuit 410; an RF voltage amplitude detector 420; a drive controller 430; a gain element 440; a dynamic impedance transformer 460; and a dynamic impedance transformer controller 470. RF amplifier 400 further includes input DC blocking element 415, RF blocking element 425, and output DC blocking element 435. In general, gain element 440 may comprise an RF power transistor such as a field effect transistor (FET) or bipolar junction transistor (BJT), biased as appropriate. Input and output DC blocking elements 415, 435 are in most cases capacitors, while RF blocking element 425 in most cases is an inductor or transmission line presenting a high impedance at the operating RF frequencies. As seen in FIG. 4, an output of dynamic impedance transformer 460 is connected to load 40 (e.g., an antenna) which is not part of RF amplifier 400.

The operation of the RF amplifier 400 is similar to the operation described above for RF amplifier 300, with the following significant differences. As seen in FIG. 4, RF voltage amplitude detector 420 detects the amplitude of the RF voltage at node 475 and outputs a feedback voltage that increases whenever the detected RF voltage increases, and decreases whenever the detected RF voltage decreases. Meanwhile, drive controller 430 comprises an amplifier 432 which receives at a negative input terminal the feedback voltage from RF voltage amplitude detector 420, and receives at a positive input a control set point voltage. Amplifier 432 amplifies a difference between the feedback voltage and the control set point voltage as a first control signal to the drive controller 430. If the amplitude of the RF voltage at node 475 tends to increase, for example as a result of a change in the characteristics of dynamic impedance transformer 460 under control of dynamic impedance transformer controller 470, then the feedback voltage will decrease the drive applied to gain element 440. The net effect is to maintain the amplitude of the RF voltage at node 475 at a substantially constant value—in particular, a value where gain element 440 operates at or near its point of maximum energy conversion efficiency. The control set point voltage is selected so that the feedback loop settles at this operating point.

Figure 5:
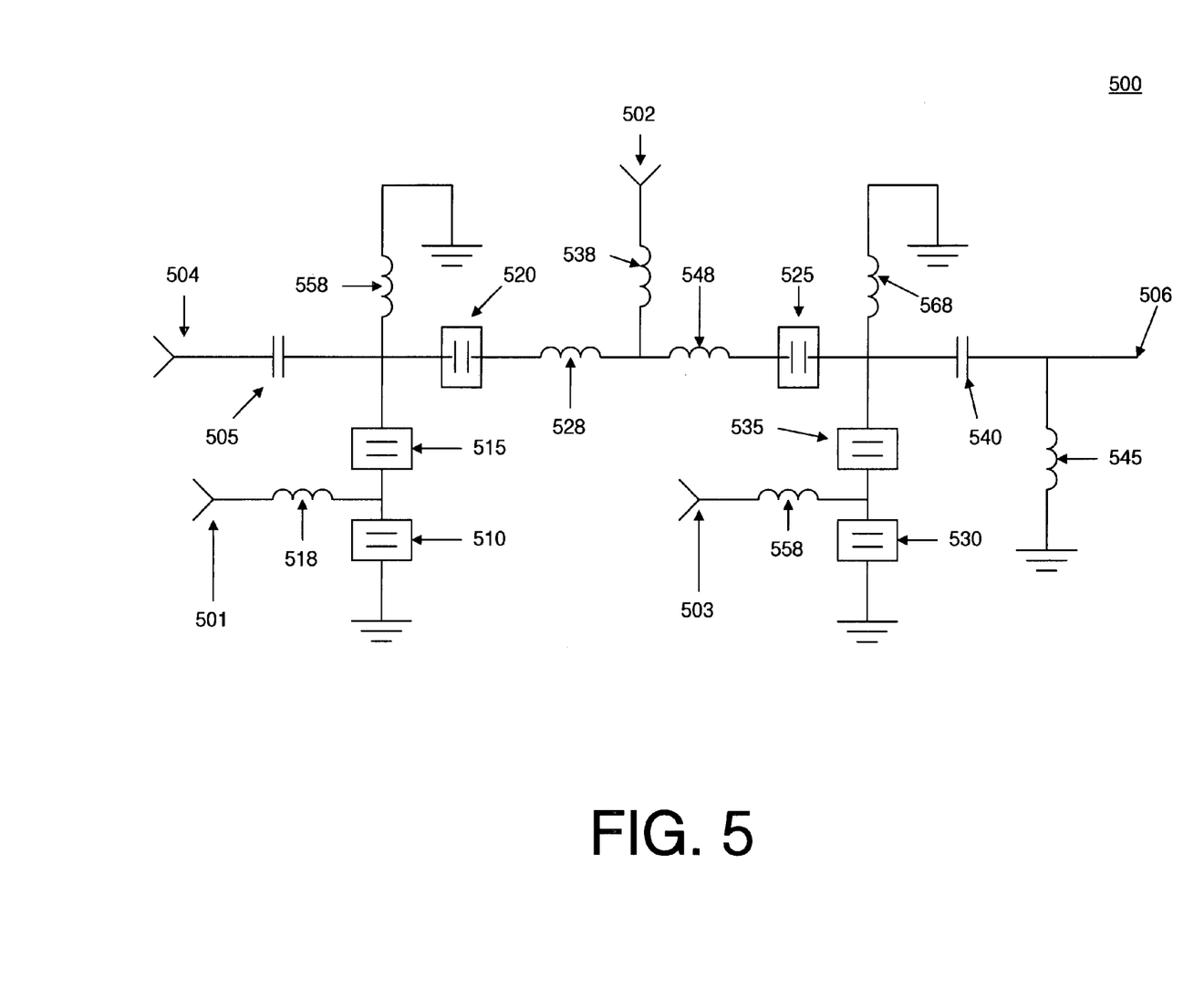
FIG. 5 shows one embodiment of a dynamic impedance transformer.

FIG. 5 shows one embodiment of a dynamic impedance transformer 500 that may be employed as dynamic impedance transformer 260, 360, or 460 in RF amplifier 200, 300, or 400, respectively. Dynamic impedance transformer 500 includes: an input 504 connected to a first DC blocking capacitor 505; first and second variable capacitance devices 510 and 515 connected to a first control port 501 via a first RF choke 518; third and fourth variable capacitance devices 520 and 525 connected to a second control port 502 via second, third, and fourth RF chokes 528, 538 and 548; fifth and sixth variable capacitance devices 530 and 535 connected to a third control port 503 via a fifth RF choke 558; a second DC blocking capacitor 540 connected to an output 506; and an output inductor 545 connected between output 506 and ground. Dynamic impedance transformer 500 further includes RF chokes 558 and 568 connecting second, third, fourth, and sixth variable capacitance devices 515, 520, 525 and 535, respectively, to ground.

In one embodiment, for example, when dynamic impedance transformer 500 is employed as dynamic impedance transformer 260 in RF amplifier 200, first DC blocking capacitor 505 may replace output DC blocking element 235. In one embodiment, variable capacitance elements 510, 515, 520, 525, 530 and 535 are paraelectric capacitors. In particular, variable capacitance elements 510, 515, 520, 525, 530 and 535 may be Barium Strontium Titanate (BST) devices. Also, dynamic impedance transformer 500 is configured as a so-called "PI-network," but in some circumstances, other arrangements may be possible, such as a "T-network."

In operation, input 504 receives the amplified RF signal and outputs the RF output signal from output 506. Meanwhile, a control signal comprising three voltage waveforms applied to control ports 501, 502, and 503, is used to control the impedance seen at the input 504 in a dynamic manner when the output 506 is connected to a particular load (e.g., 50 or 75 ohms).

Figure 6:
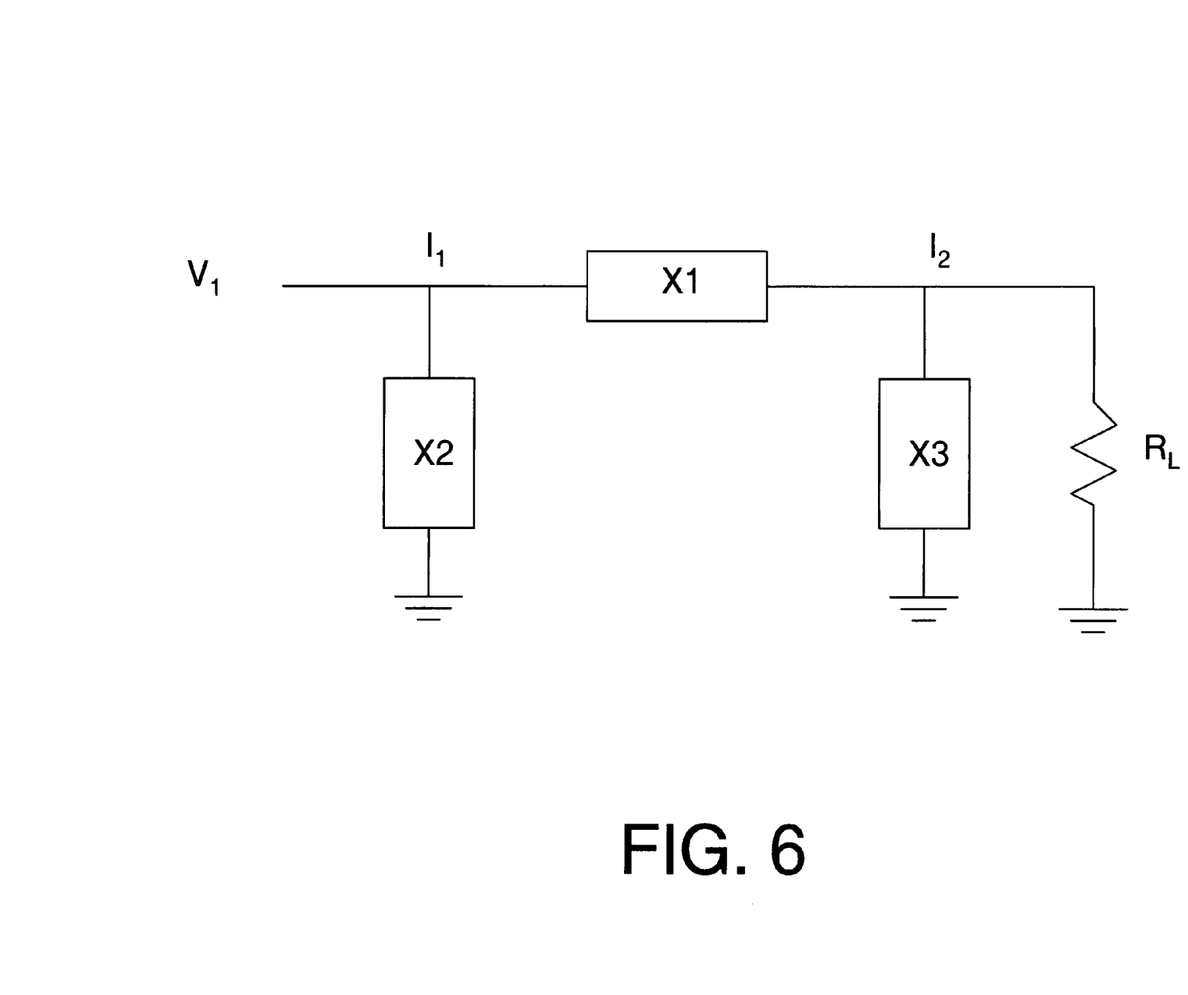
FIG. 6 is an idealized equivalent circuit of the dynamic impedance transformer of FIG. 5.

FIG. 6 is an idealized equivalent circuit of the dynamic impedance transformer 300 where all of the impedances $X_1$, $X_2$ and $X_3$ are all pure reactances. The load impedance 506 of FIG. 5 has been transformed by inductor 545 and capacitor 540 into equivalent real load resistance $R_L$ of FIG. 6. An example will now be provided illustrating on embodiment of a method of determining the desired values for reactances $X_1$, $X_2$ and $X_3$ and thus to determine the voltages to be applied to control ports 501, 502, and 503, in FIG. 5.

In particular, for example, in one embodiment of amplifier 200, it is desired to control the reactances $X_1$, $X_2$ and $X_3$ such that:

$$\left[\frac{V_1}{I_1}\right] \text{ is any REAL value} \left(\text{i.e., } IMAG\left[\frac{V_1}{I_1}\right] = 0\right); \text{ and} \quad (3)$$

$$\angle\left[\frac{I_2}{I_1}\right] \text{ is independent of } \left\|\frac{I_2}{I_1}\right\|, \quad (4)$$

where $\angle\left[\frac{I_2}{I_1}\right]$ is the phase angle of $\left[\frac{I_2}{I_1}\right]$ From inspection of FIG. 4:

$$\frac{V_1}{I_1} = \frac{jX_1(jR_LX_3 + jR_LX_2 - X_2X_3)}{jR_LX_3 + jR_LX_2 + jR_LX_1 - X_2X_3 - X_1X_3} \quad (5)$$

Equation (5) can be rewritten as:

$$\frac{I_1}{V_1} = \frac{-jR_L(X_1 + X_2 + X_3) + X_3(X_1 + X_2)}{R_LX_1(X_2 + X_3) + jX_1X_2X_3} \quad (6)$$

Now, to apply equation (3) above, we can multiple the numerator and denominator of equation (5) by the complex conjugate of the denominator, retain the imaginary part and set it to zero, in which case we find that:

$$R_L^2(X_1+X_2+X_3)(X_2+X_3) = -X_2X_3^2(X_1+X_2) \quad (7)$$

Solving equation (7) for $X_1$, yields:

$$X_1 = \frac{R_L^2(X_2 + X_3)^2 + X_2^2 X_3^2}{R_L^2(X_2 + X_3) + X_2 X_3^2} \quad (8)$$

Meanwhile, from inspection of FIG. 4:

$$I_2 = I_1\left(\frac{jX_3}{R_L + jX_3}\right)\left(\frac{jX_1}{j(X_1 + X_2) + \frac{jR_LX_3}{R_L + jX_3}}\right) \quad (9)$$

This can be reduced algebraically to produce equation (10):

$$\angle\left[\frac{I_2}{I_1}\right] = \text{TAN}^{-1}\left[\frac{R_L(X_1 + X_2 + X_3)}{X_3(X_1 + X_2)}\right] \quad (10)$$

By substituting equation (8) into equation (10), we get:

$$\angle\left[\frac{I_2}{I_1}\right] = \text{TAN}^{-1}\left[\frac{-X_2X_3}{R_L(X_2 + X_3)}\right] \quad (11)$$

Accordingly, $$\angle\left[\frac{I_2}{I_1}\right]$$

will remain constant with respect to $X_1$, $X_2$ and $X_3$ only if:

$$-X_2X_3 = KR_L(X_2+X_3), \text{ where } K \text{ is a constant.} \quad (12)$$

Now, returning to equation (6) and substituting for $X_1$ using equation (8), we get:

$$\frac{I_1}{V_1} \equiv \frac{1}{R_T} = \frac{X_3^2 R_L}{R_L^2(X_2 + X_3)^2 + X_2^2 X_3^2}, \quad (13)$$

where $R_T$ is the input impedance of the dynamic impedance transformer, looking at the load.

Rewriting equation (13) using equation (12), we get:

$$X_2^2 = \left(\frac{K^2}{K^2 + 1}\right) R_T R_L \quad (14)$$

To make the following math easier, we define:

$$Q \equiv \sqrt{\frac{K^2}{K^2 + 1}} \quad (15a)$$

$$K = \sqrt{\frac{Q^2}{1 - Q^2}} \quad (15b)$$

In that case, equation (14) can be rewritten as;

$$X_2 = Q\sqrt{R_T R_L} \text{ or } \frac{X_2}{R_L} = Q\sqrt{\frac{R_T}{R_L}} \quad (16)$$

Using the equations and definitions above, one can derive:

$$X_3 = \frac{-Q\sqrt{R_T R_L}}{1 \pm \sqrt{\frac{R_T}{R_L}(1 - Q^2)}} \text{ or } \frac{X_3}{R_L} = \frac{-Q\sqrt{\frac{R_T}{R_L}}}{1 \pm \sqrt{\frac{R_T}{R_L}(1 - Q^2)}} \text{ and} \quad (17)$$

$$X_1 = \frac{-Q\sqrt{R_T R_L}}{Q^2 + \sqrt{\frac{R_T}{R_L}(1 - Q^2)} \pm (1 - Q^2)} \quad (18)$$

Thus it is seen that values for reactances $X_1$, $X_2$ and $X_3$ can be determined using equations (15a), (16), (17), and (18). Note that Q is a free parameter, and may take any value between −1 and +1. From there, given the known capacitance vs. voltage characteristics of the variable capacitance elements 510, 515, 520, 525, 530 and 535, the voltages can be obtained that should be applied to control ports 501, 502, and 503 to form the control signal for dynamic impedance transformer 500.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A radio frequency (RF) amplifier, comprising:
an amplitude detector;
an RF drive adjust circuit adapted to receive an input signal and to adjust at least one of the amplitude and phase thereof in response to a first control signal to produce a drive-adjusted input signal;
a drive controller adapted to provide the first control signal to the RF drive adjust circuit in response to an output of the amplitude detector;
a gain element adapted to amplify the drive-adjusted input signal and to output an amplified signal;
a dynamic impedance transformer adapted to receive the amplified signal and a second control signal, to output an output signal, and to transform a load impedance presented to the gain element by a load in accordance with the second control signal; and
a dynamic impedance transformer controller adapted to provide the second control signal to the dynamic impedance transformer in accordance with a desired amplitude of an envelope of the output signal.

2. The RF amplifier of claim 1, wherein the dynamic impedance transformer is a PI-network, comprising a first shunt capacitance branch, a series inductance branch, and a second shunt capacitance branch, where the series inductance branch is connected between the first and second shunt capacitance branches.

3. The RF amplifier of claim 2, wherein the first and second shunt capacitance branches each include at least one variable capacitance device adapted to receive a voltage of the second control signal.

4. The RF amplifier of claim 3, wherein the variable capacitance device is a Barium Strontium Titanate (BST) device.

5. The RF amplifier of claim 1, wherein the amplitude detector is an RF amplitude detector adapted to detect an amplitude of an envelope of an input signal to the RF amplifier.

6. The RF amplifier of claim 1, wherein the amplitude detector is an RF voltage amplitude detector adapted to detect an amplitude of an RF voltage of the amplified signal.

7. A method of amplifying a radio frequency (RF) signal, comprising:
receiving an input signal;
adjusting at least one amplitude and a phase of the input signal;
amplifying the adjusted input signal with a gain element to produce an output signal; and
transforming a load impendance presented to gain element by a load in accordance with a desired amplitude of an envelope of the output signal,
wherein adjusting at least one of an amplitude and a phase of the input signal comprises:
detecting an amplitude of an envelope of one of: (1) the input signal, and (2) a signal at an output of the gain element;
producing a first control signal in response to the detected envelope amplitude; and
adjusting at least one of an amplitude and a phase of the input signal in response to the first control signal.

8. The method of claim 7, wherein producing the first control signal in response to the detected amplitude of the envelope of the input signal comprises looking up in a look-up table a first control signal value corresponding to the detected amplitude of the envelope of the input signal.

9. The method of claim 8, wherein transforming the load impedance presented to the gain element by the load in accordance with the amplitude of the desired amplitude of the envelope of the output signal, comprises:
producing a second control signal in response to the detected amplitude of the envelope of the input signal; and
transforming the load impedance presented to the gain element by the load in response to the second control signal.

10. The method of claim 9, wherein producing the second control signal in response to the detected amplitude of the envelope of the input signal comprises looking up in a second look-up table a second control signal value corresponding to the detected amplitude of the envelope of the input signal.

11. The method of claim 7, wherein transforming the load impedance presented to the gain element by the load in accordance with the desired amplitude of the envelope of the output signal, comprises:
producing a second control signal in response to the detected amplitude of the envelope of the input signal; and
transforming the load impedance presented to the gain element by the load in response to the second control signal.

12. The method of claim 7, wherein adjusting at least one of an amplitude and a phase of the input signal comprises:
detecting an amplitude of an RF voltage of the amplified signal; and
producing a feedback signal from the detected amplitude of the RF voltage of the amplified signal to adjust at least one of an amplitude and a phase of the input signal to maintain the RF voltage of the amplified signal at a substantially constant value.

13. A radio frequency (RF) amplifier, comprising:
an RF drive adjust circuit adapted to receive an input Signal and to adjust at least one of the amplitude and phase thereof to output a drive-adjusted input signal;
a gain element adapted to amplify the drive-adjusted input signal and to output an amplified signal;
a dynamic impendance transformer adapted to receive the amplified signal, to output an output signal, and to transform a load impendance presented to gain element by a load in accordance with a desired amplitude of an envelope of the output signal;
an RF voltage amplitude detector adapted to detect an amplitude of an RF voltage of the amplified signal; and
a drive controller adapted to provide a first control signal to the RF drive adjust circuit to adjust at least one of the amplitude and phase of the input signal in response to the detected amplitude of the envelope of the amplified signal.

14. The RF amplifier of claim 13, further comprising:
an envelope amplitude detector adapted to detect an amplitude of an envelope of the input signal; and
a dynamic impedance transformer controller adapted to provide a second control signal to the dynamic impedance transformer in response to the detected amplitude of the envelope of the input signal.

15. The RF amplifier of claim 14, wherein the dynamic impedance transformer is a PI-network, comprising a first shunt capacitance branch, a series inductance branch, and a second shunt capacitance branch, where the series inductance branch is connected between the first and second shunt capacitance branches.

16. The RF amplifier of claim 15, wherein the first and second shunt capacitance branches each include at least one variable capacitance device adapted to receive a voltage of the second control signal.

17. The RF amplifier of claim 16, wherein the variable capacitance device is a Barium Strontium Titanate (BST) device.

18. The method of claim 12, further comprising generating the first control signal in response to a difference between the feedback signal and a control set point voltage.

19. The RF amplifier of claim 13, wherein the RF voltage amplitude detector produces a feedback signal from the detected amplitude of the RF voltage of the amplified signal, and wherein the drive controller comprises an amplifier for generating the control signal as a difference between the feedback signal and a control set point voltage.

* * * * *

UNITED STATES PATENT AND TRADEMARK OFFICE
CERTIFICATE OF CORRECTION

| | | |
|---|---|---|
| PATENT NO. | : 7,463,092 B2 | Page 1 of 1 |
| APPLICATION NO. | : 11/514148 | |
| DATED | : December 9, 2008 | |
| INVENTOR(S) | : John Stephen Kofol | |

It is certified that error appears in the above-identified patent and that said Letters Patent is hereby corrected as shown below:

Column 11, Line 46, Claim 7, after "one" insert -- of an --;

Column 11, Line 50, Claim 7, delete "impendance" and insert -- impedance --;

Column 11, Line 50, Claim 7, after "to" insert -- the --;

Column 12, Line 37, Claim 13, delete "Signal" and insert -- signal --;

Column 12, Line 42, Claim 13, delete "impendance" and insert -- impedance --;

Column 12, Line 44, Claim 13, delete "impendance" and insert -- impedance --.

Signed and Sealed this

Second Day of November, 2010

David J. Kappos
*Director of the United States Patent and Trademark Office*